US007141836B1

United States Patent
Adkisson et al.

(10) Patent No.: US 7,141,836 B1
(45) Date of Patent: Nov. 28, 2006

(54) PIXEL SENSOR HAVING DOPED ISOLATION STRUCTURE SIDEWALL

(75) Inventors: James W. Adkisson, Jericho, VT (US); Mark D. Jaffe, Shelburne, VT (US); Robert K. Leidy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,885

(22) Filed: May 31, 2005

(51) Int. Cl.
*H01L 27/148* (2006.01)
(52) U.S. Cl. .............................. 257/233; 257/E27.133
(58) Field of Classification Search .................. 257/59, 257/72, 222, 225, 232–234, 440, E27.13, 257/E27.132, E27.133, E27.141, E27.148, 257/E27.15, 240, 246, 247, 248, 461, 465, 257/E27.131
See application file for complete search history.

(56) References Cited

U.S. PATENT DOCUMENTS

| | | | |
|---|---|---|---|
| 5,516,711 A | 5/1996 | Wang | |
| 6,500,692 B1 | 12/2002 | Rhodes | |
| 6,509,221 B1 | 1/2003 | Doris et al. | |
| 6,551,910 B1 | 4/2003 | Ohashi | |
| 6,611,037 B1 | 8/2003 | Rhodes | |
| 6,730,980 B1 | 5/2004 | Rhodes | |
| 6,767,759 B1 | 7/2004 | Rhodes | |
| 2004/0173799 A1* | 9/2004 | Patrick | 257/72 |
| 2004/0178430 A1 | 9/2004 | Rhodes et al. | |
| 2005/0151218 A1* | 7/2005 | Mouli | 257/446 |

* cited by examiner

*Primary Examiner*—Brook Kebede
(74) *Attorney, Agent, or Firm*—Scully, Scott, Murphy & Presser, P.C.; Anthony J. Canale (57) ABSTRACT

A novel pixel sensor structure formed on a substrate of a first conductivity type includes a photosensitive device of a second conductivity type and a surface pinning layer of the first conductivity type. An isolation structure is formed adjacent to the photosensitive device pinning layer. The isolation structure includes a dopant region comprising material of the first conductivity type selectively formed along a sidewall of the isolation structure that is adapted to electrically couple the surface pinning layer to the underlying substrate. The corresponding method for forming the dopant region selectively formed along the sidewall of the isolation structure comprises an out-diffusion process whereby dopant materials present in a doped material layer formed along selected portions in the isolation structure are driven into the underlying substrate during an anneal. Alternately, or in conjunction, an angled ion implantation of dopant material in the isolation structure sidewall may be performed by first fabricating a photoresist layer and reducing its size by removing a corner, or a corner portion thereof, which may block the angled implant material.

15 Claims, 7 Drawing Sheets

PIXEL SENSOR HAVING DOPED ISOLATION STRUCTURE SIDEWALL

CROSS REFERENCE TO RELATED APPLICATION

The present invention is related to commonly-owned, co-pending U.S. patent application Ser. No. 10/905,043 entitled A MASKED SIDEWALL IMPLANT FOR IMAGE SENSOR and filed Dec. 13, 2004, the whole contents and disclosure of each of which is incorporated by reference as if fully set forth herein.

FIELD OF THE INVENTION

The present invention relates generally to the fabrication of semiconductor pixel sensor arrays, and more particularly, to a novel pixel sensor cell structure including a selectively doped sidewall and process therefor.

BACKGROUND OF THE INVENTION

Figure 1:
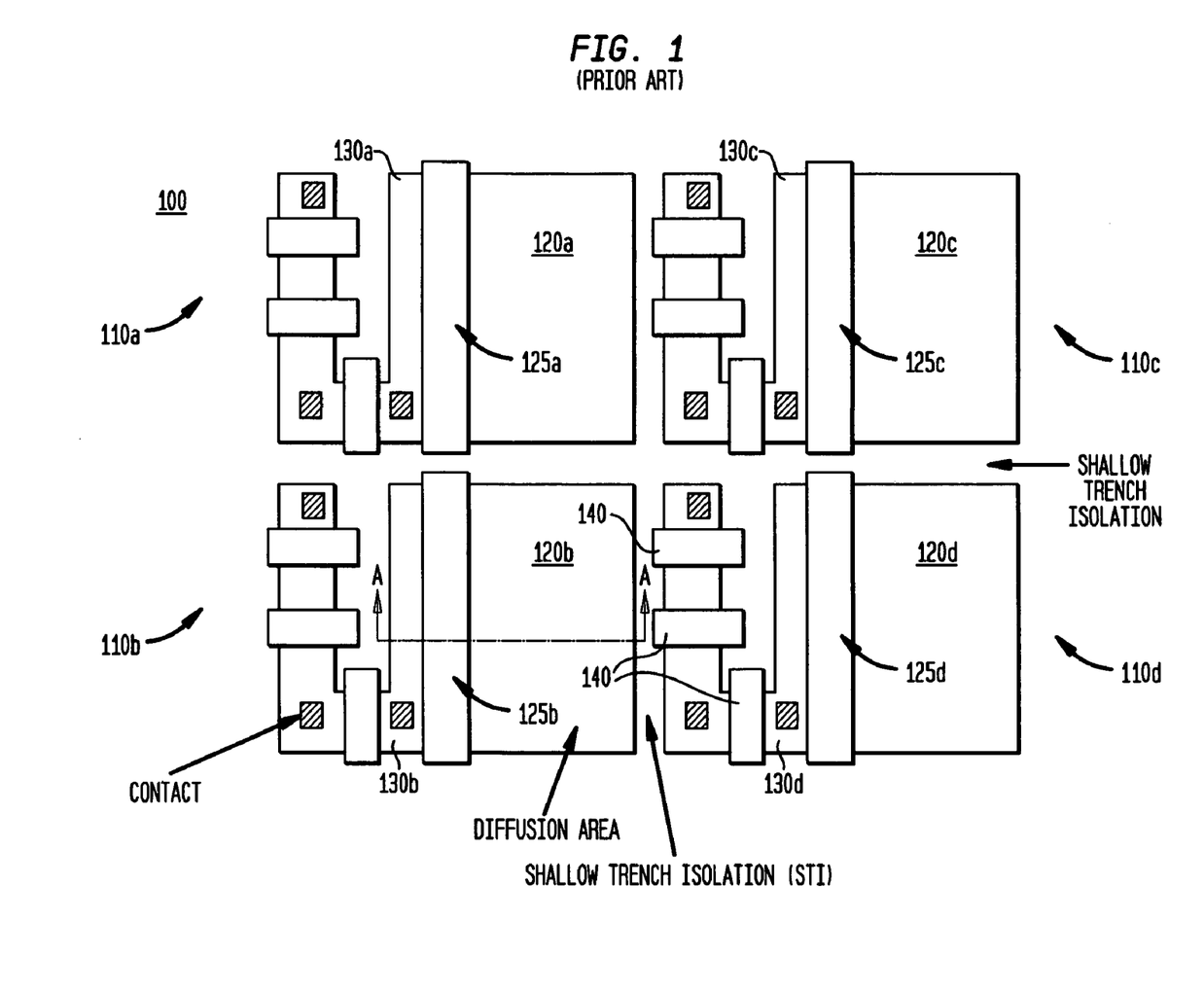
FIG. 1 depicts a portion of an example current pixel sensor comprising an array 100 of pixel sensor cells according to the prior art.

As shown in FIG. 1, current CMOS image sensors comprise an array 100 of pixel sensor cells, four (4) of which labeled 110a, . . . ,110d are depicted in FIG. 1. Each of the cells 110a, . . . ,110d are used to collect light energy and convert it into readable electrical signals. Each pixel sensor cell 110 comprises a photosensitive element, such as a photodiode, photogate, or photoconductor overlying a doped region of a substrate for accumulating photo-generated charge in an underlying portion thereof. The group of four pixel cells 110a, . . . ,110d depicted in FIG. 1 include photosensitive element such as collection well or photodiode device structures 120a, . . . ,120d, respectively. A read-out circuit is connected to each pixel cell and often includes a diffusion region for receiving charge from the photosensitive element, when read-out. Typically, this is accomplished with a transistor device having a gate electrically connected to a floating diffusion region. The group of four pixel cells 110a, . . . , 110d depicted in FIG. 1 include polysilicon transfer gate structures 125a, . . . ,125d, respectively, for transferring charge from the respective photosensitive elements 120a, . . . ,120d across a surface channel to respective floating diffusion regions 130a, . . . ,130d, that include one or more transistors, e.g., CMOS FET devices having narrow FET gate regions 140, for selecting and gating a pixel output signal or, resetting the floating diffusion region to a predetermined charge level prior to charge transfer.

Figure 2:
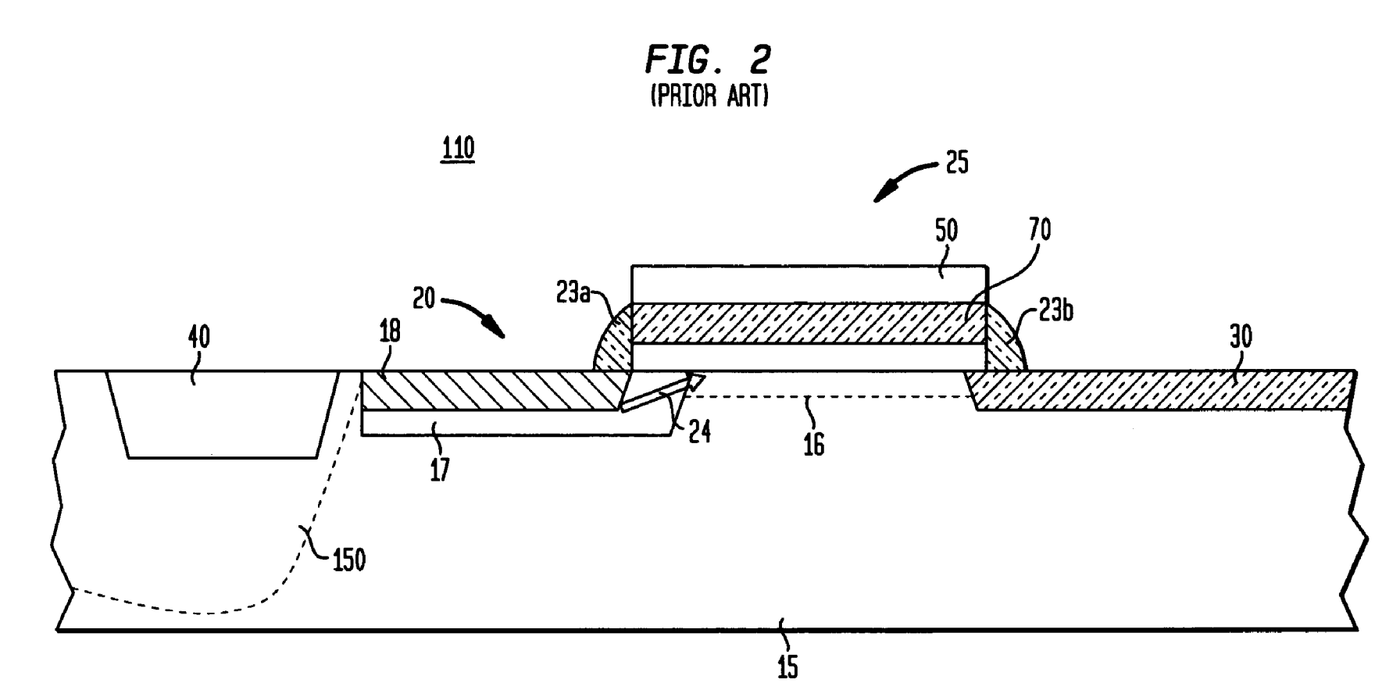
FIG. 2 depicts one pixel sensor cell 110 including a pinned photodiode 20 through a cross-sectional view taken along line A—A depicted in FIG. 1.

FIG. 2 depicts in greater detail a typical pixel sensor cell 110 taken along line A—A of FIG. 1. As shown in FIG. 2, image sensor cell 110 includes a pinned photodiode 20 having a pinning layer 18 doped p+-type and, an underlying lightly doped n-type region 17. Typically, the pinned diode 20 is formed on top of a p-type substrate 15 or a p-type epitaxial layer or p-well surface layer having a lower p-type concentration than the diode pinning layer 18. As known, the surface pinning layer 18 is in electrical contact with the substrate 15 (or p-type epitaxial layer or p-well surface layer). The photodiode 20 thus has two p-type regions 18 and 15 having a same potential so that the n-type doped region 17 is fully depleted at a pinning voltage (Vp). That is, the surface pinning layer 18 is in electrical contact to the substrate in order to cut down on dark current. The pinned photodiode is termed "pinned" because the potential in the photodiode is pinned to a constant value, Vp, when the photodiode is fully depleted.

As further shown in FIG. 2, the n-type doped region 17 and p+ region 18 of the photodiode 20 are spaced between an isolation structure 40, e.g., a shallow trench isolation (STI), and a charge transfer transistor gate 25 which is surrounded by thin spacer structures 23a,b. The STI region 40 is located proximate the pixel imager cell for isolating the cell from an adjacent pixel cell. In operation, light coming from the pixel is focused onto the photodiode where electrons collect at the n-type region 17. When the transfer gate 25 is operated, i.e., turned on by applying a voltage to the transfer gate 70 comprising, for example, an n-type doped polysilicon layer 70, the photo-generated charge 24 is transferred from the charge accumulating doped n-type doped region 17 via a transfer device surface channel 16 to a floating diffusion region 30, e.g., doped n+ type.

As mentioned, in each pixel image cell, the surface pinning layer 18 is in electrical contact to the substrate 15 of the same conductivity type. Currently, the surface pinning layer (e.g., p-type doped) of the pixel sensor collection diode is connected to the substrate via a well implant structure 150 (e.g., doped p-type) located on one of the edges of the collection diode 20. In practice, the underlying substrate well structure (e.g., p-well 150) is created by a mask implant technique, as are the photodiode and pinning layer structures and each are formed in separate processing steps.

It is also advantageous to have doping on the STI sidewall adjacent to the collection diode in order to minimize the dark current of the pixel sensor. If the n-type collection diode comes into contact with the STI sidewall, than any surface states along the substrate—STI interface will be uncovered by depleted silicon when the collection diode is in its reset state. This is the optimal condition for surface generation which would contribute to dark current in the pixel sensor. If the STI sidewall adjacent to the collection diode is doped p-type, holes will shield the surface and prevent surface generation.

One technique is to provide the adjacent isolation structure with a sidewall implant region for ensuring improved alignment of conductive material and proper electrical contact between the surface pinning layer above the collection well device and the underlying substrate.

Angled implant techniques for doping the STI sidewalls and bottom for providing electrical connection from the substrate to a surface pinning layer for the pixel imager cell are known in the art, for example, as described in United States Patent Application Publication No. 2004/0178430. A further method to allow the masking of such an angled implant with tight layout rules by rounding the corner of the photo resist is described in above-mentioned, commonly-owned, co-pending U.S. patent application Ser. No. 10/905,043.

While doping the sidewall of STI is useful in a pixel sensor on the portion of the STI surrounding the photo diode, it may have deleterious effects in other portions of the array. This is because higher doping on the STI sidewalls of narrow field effect transistors (FETs) can significantly increase the threshold voltage, decrease the drive current strength, and increase the substrate voltage sensitivity of the transistors. Furthermore, doping of the sidewall of a diffusion will partially counter dope the source-drain diffusions of those transistors. If the net doping result is low enough, this can cause generation current. All of these effects are counter to what is desired in an imaging cell. Thus, when the angled implant technique described in the prior art results in doping of the sidewall proximate the narrow FET gates 140, this leads to a totally unacceptable condition, especially as only narrow FETs are implemented in an image sensor where size is at a premium.

It would thus be highly desirable to provide an isolation structure used in isolating pixel sensor devices that include sidewalls that are selectively doped in order to avoid the disadvantageous effects that may result when implementing prior art techniques that may cause implant doping of isolation structure sidewall regions proximate to FETs.

SUMMARY OF THE INVENTION

This invention particularly addresses a pixel sensor structure and a method of fabrication that includes an improved technique for tailoring the doping provided in isolation structure sidewalls in order to avoid potentially deleterious effects that may result when doping isolation structure sidewalls proximate to FETs.

According to one aspect of the invention, there is provided an isolation structure separating adjacent pixel sensor cells that is doped only on certain sidewalls and certain portions of the bottom. This enables the doping of the sidewalls of the pixel sensor photo diode while not doping the sidewalls of other structures. In accordance with this aspect of the invention, isolation structure sidewalls are doped by a diffusion process whereby dopants from deposited materials, are out diffused for doping the sidewalls at select locations. Such a material can be deposited on the surface of the sidewall. A further mask and an etch process can leave the material only where doping is desired. Then, an anneal step will cause the diffusion of the dopant into the silicon without any implantation being performed.

Thus, according to one aspect of the invention, there is provided a method for forming a pixel sensor cell structure comprising the steps of:

a) providing a substrate of a first conductivity type;

b) forming a trench adjacent to a location of a photosensitive device having a surface pinning layer of the first conductivity type, the trench defining an isolation structure having sidewalls; and c) selectively forming a dopant material region of the first conductivity type along a first sidewall of the trench, the first sidewall adapted for electrically coupling a formed pinning layer to the substrate.

In one embodiment, the step of selectively forming a dopant material region comprises steps of: forming a doped material layer inside the trench; and, out-diffusing dopant material from the doped material layer into said first sidewall of the isolation structure to form the dopant material region of the first conductivity type.

Alternately, or in conjunction, the step of selectively forming a dopant material region comprises steps of: forming a photoresist layer patterned atop a substrate surface to expose the first sidewall of the isolation structure; tailoring the size of the patterned photoresist layer to facilitate ion implanting of dopant material in the exposed first sidewall of the isolation structure; and, forming a dopant region comprising implanted dopant material of the first conductivity type along the exposed first sidewall.

According to another aspect of the invention, there is provided a pixel cell array comprising at least two pixel cells, the array comprising:

a first pixel cell adjacent to a second pixel cell;

a first isolation structure isolating the first and second pixel cells, the first isolation structure having sidewalls, wherein a first sidewall adjacent to the first pixel cell is selectively doped with a dopant material and a second sidewall adjacent to the second pixel cell is not selectively doped with the dopant material.

The pixel cell array according to this aspect further comprises:

a third pixel cell adjacent to the first pixel cell; and, a second isolation structure isolating the first and third pixel cells, the second isolation structure having sidewalls, wherein a first sidewall of the second isolation structure adjacent to the first pixel cell is doped with a dopant material, and a second sidewall of the second isolation structure adjacent to the third pixel cell is doped with the dopant material.

According to a further aspect of the invention, there is provided a method for forming a pixel cell array comprising the steps of:

a) forming a first pixel cell adjacent to a second pixel cell;

b) forming a first isolation structure between the first and second pixel cells for isolating the first and second pixel cells, the first isolation structure having sidewalls; and c) selectively forming a dopant material region of a first conductivity type along a first sidewall of the first isolation structure.

According to this further aspect of the invention, the step of selectively forming said dopant material region comprises:

forming a doped material layer inside said first isolation structure; and, out-diffusing dopant material from said doped material layer into said first sidewall of said first isolation structure to form a dopant material region of the first conductivity type along said first sidewall.

Alternately, or in conjunction, the step of selectively forming said dopant material region comprises:

forming a photoresist layer patterned atop a substrate surface to expose said first sidewall of said first isolation structure;

tailoring the size of said patterned photoresist layer to facilitate ion implanting of dopant material in said exposed first sidewall of said first isolation structure; and, forming a dopant region comprising implanted dopant material of the first conductivity type along said exposed first sidewall of said first isolation structure.

The method of forming the pixel cell array according to this further aspect further comprises:

forming a third pixel cell adjacent to the first pixel cell;

forming a second isolation structure between the first and third pixel cells for isolating the first and third pixel cells, the second isolation structure having sidewalls, and, forming a dopant material region of a first conductivity type along a first sidewall of the second isolation structure adjacent to the first pixel cell, and, forming a dopant material region of the first conductivity type along a second sidewall of the second isolation structure adjacent to the third pixel cell.

Advantageously, providing the electrical coupling between the surface pinning layer of the collection well device and the underlying substrate formed according to methods of the invention obviates the alignment tolerance, enabling larger collection diodes and increased optical efficiencies.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE PREFERRED EMBODIMENTS

According to one aspect of the invention, there is provided an improved doping technique in a method for manufacturing a pixel sensor cell that ensures proper electrical connection between the surface pinning layer of the collection well device and the underlying substrate while avoiding potential deleterious effects obtained when performing angled implant doping of isolation structures.

Figure 3:
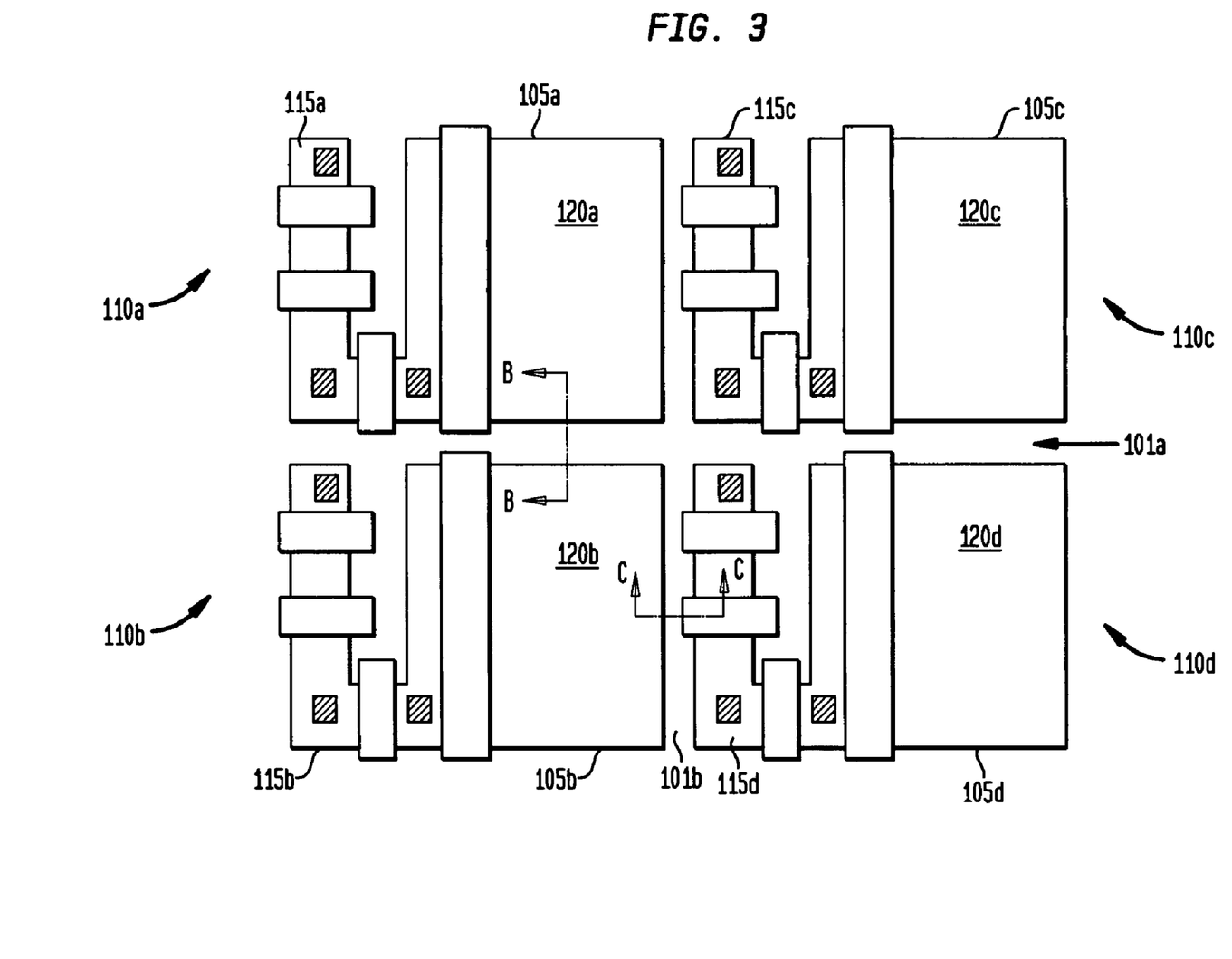
FIG. 3 illustrates the portion of an example current image sensor comprising an array 100 of pixel sensor cells separated by isolation structures 101a,b having selectively doped sidewalls according to the present invention.

FIG. 3 illustrates the portion of an example current pixel sensor device as shown in FIG. 1 comprising the array 100 of pixel sensor cells 110a, . . . ,110d separated by isolation structures 101a,b having selectively doped sidewalls according to the present invention. In FIG. 3, there is shown respective sidewalls 105a, . . . ,105d of isolation structures 101a,b that are to be advantageously doped to ensure proper electrical connection between the surface pinning layer of the respective adjacent collection well device and the underlying substrate; and respective sidewalls 115a, . . . ,115d of the isolation structures 101a,b where sidewall doping is to be avoided according to the invention.

Figure 4A:
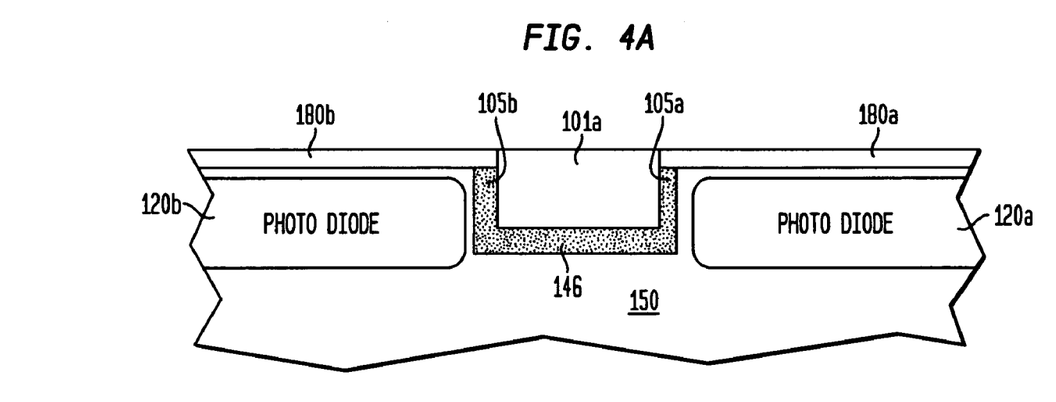
FIG. 4(a) depicts, through a cross-sectional view taken along line B—B depicted in FIG. 3, a doped isolation structure 101a separating pixel sensor cells 110a and 110b formed in accordance with the invention; and, FIG. 4(b) depicts, through a cross-sectional view taken along line C—C depicted in FIG. 3, a partially doped isolation structure 101b separating pixel sensor cells 110b and 110d formed in accordance with the invention.

FIG. 4(a) depicts, through a cross-sectional view taken along line B—B depicted in FIG. 3, the doped isolation structure 101a separating pixel sensor cells 110a and 110b. As shown in FIG. 4(a), the isolation structure 101a having a doped sidewall separates two photodiode regions 120a, 120b of adjacent cells 110a and 110b. As it necessary to ensure proper electrical connection between the doped surface pinning layers 180a, 180b of respective photodiode regions 120a, 120b and the underlying substrate 150, it is advantageous to provide dopant material into both the isolation structure sidewalls 105b and 105a and isolation structure bottom 146 of structure 101a. The doping of isolation structure sidewalls 105a and 105b and bottom 146 may be accomplished by an angled implant technique as described for instance, in herein incorporated, commonly-owned, co-pending U.S. patent application Ser. No. 10/905,043 or a dopant out diffusion method as described in greater detail herein.

Figure 4B:
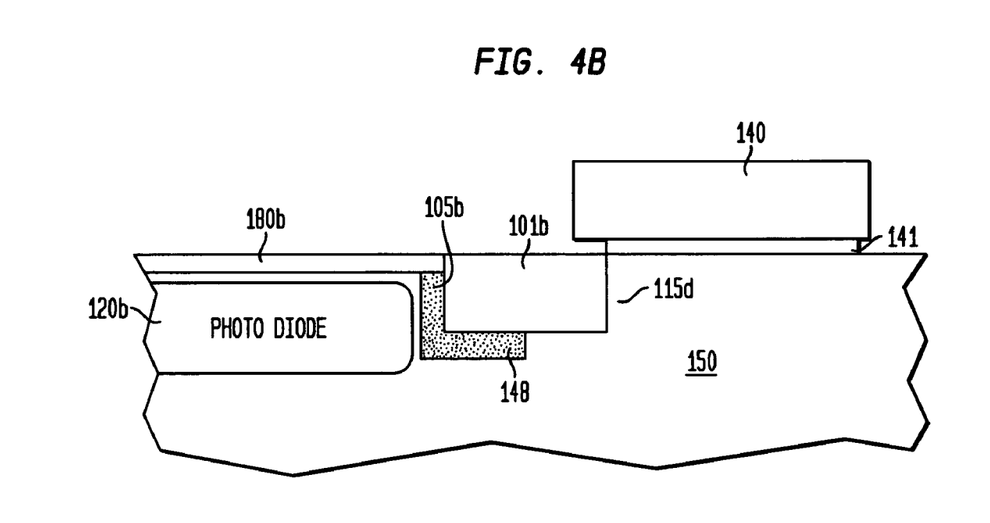

FIG. 4(b) depicts, through a cross-sectional view taken along line C—C depicted in FIG. 3, the partially doped isolation structure 101b separating pixel sensor cells 110b and 110d. As shown in FIG. 4(b), the isolation structure 101b separates the photodiode region 120b of adjacent cell 110b and a polysilicon gate of a narrow FET device 140 associated with the pixel sensor cell 110d. In this embodiment, it is only necessary to ensure proper electrical connection exists between the doped surface pinning layer 180b of photodiode region 120b and the underlying substrate 150. Consequently, it is advantageous to provide dopant material only into the isolation structure sidewall 105b and a portion 148 of the bottom region underlying the isolation structure 101b. The doping of isolation structure sidewall 105b and bottom region 148 may be accomplished by an angled implant technique or, the dopant out diffusion method as described in greater detail herein. Dopant material is intentionally not provided to the isolation structure sidewall depicted at region 115d in order to avoid the potentially deleterious effects as described herein.

FIGS. 5(a)–5(e) depict the method steps in a sensor pixel cell manufacturing process that includes the step of out-diffusing an impurity (e.g. dopant material) from a doped layer in order to form a dopant region in one or more sidewalls of a formed isolation structure associated with the cell 110 having a pinned photodiode 120. The out-diffusing step may also be used to form a dopant region in a bottom of the isolation structure. As will be explained in greater detail, the method steps include the step of out-diffusing dopant material into selective isolation structure sidewall and bottom regions to ensure that the eventual formed surface pinning layer of the pinned photodiode 120 is in electrical contact with the underlying substrate 150 while avoiding the potentially deleterious effects by selectively not out-diffusing dopant material into isolation structure sidewall and bottom regions proximate to areas where transistors may be formed. Such a process may be used to form the doped isolation structures 101a, 101b such as shown in FIGS. 4(a) and 4(b), respectively.

Figure 5A:
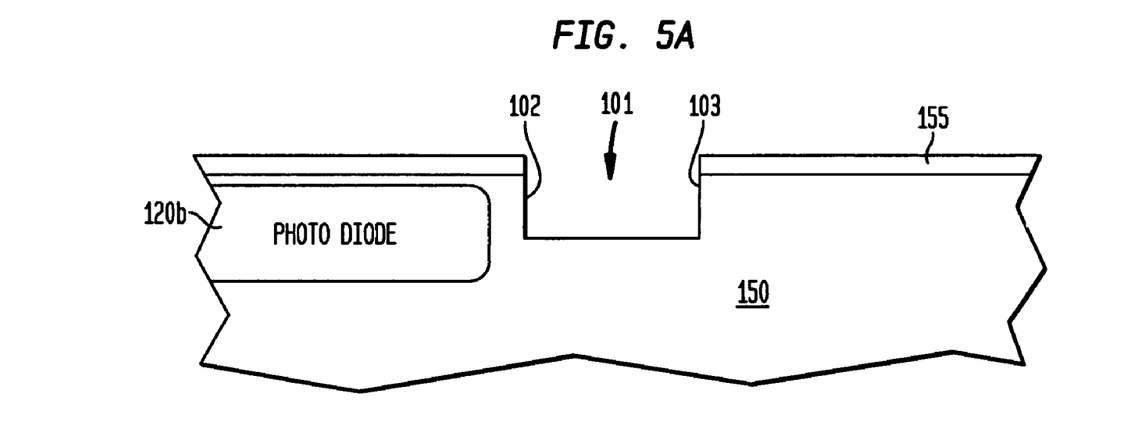
FIGS. 5(a)–5(e) depict, through cross-sectional views, an exemplary process for selectively forming doped sidewall portions of an isolation structure in accordance with the present invention; and, FIG. 6 illustrates, through a cross-sectional view, a resulting photoresist layer structure 75 patterned and etched to allow for a desired angled implant in a sidewall of an isolation structure.

In the process of forming the pixel sensor cell structure 100 of FIGS. 4(a) and 4(b), an isolation structure 101 is first formed in a bulk semiconductor substrate 150 including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 150 is a Si-containing semiconductor substrate of a first conductivity type, e.g., lightly doped with p-type dopant material such as boron or indium (beryllium or magnesium for a III–V semiconductor), to a standard concentration ranging between, for example, $1\times10^{14}$ to $1\times10^{16}$ $cm^{-3}$. Then, using standard processing techniques, the isolation structure 101 having sidewalls 102, 103 are formed in the substrate 150. That is, utilizing photolithography, a sacrificial nitride mask 155 (pad-nitride) is first applied, patterned and developed to expose open regions 101 for forming isolation structure. Subsequently, an etch process is performed to result in etched isolation structure 101. As shown in FIG. 5(a), for the embodiment of the partially doped isolation structure depicted in FIG. 4(b), adjacent etched isolation structure opening 101 formed in the substrate, there is depicted the locations where pinned photodiode 120b is to be formed.

Figure 5B:
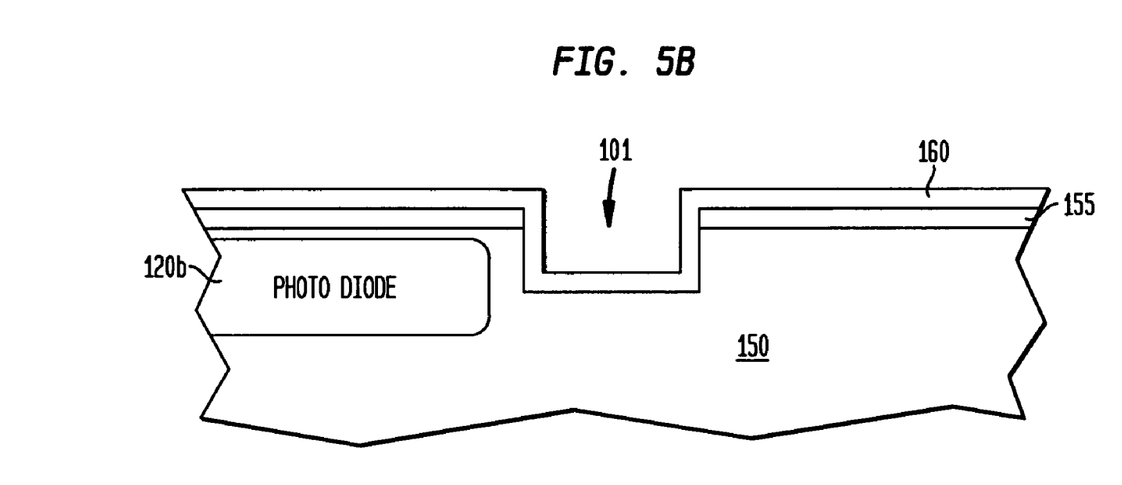

To get the surface pinning layer of the formed pinned photodiode 120b to be in electrical contact with the underlying substrate 150, a dopant material is out diffused into a sidewall of the isolation structure prior to filling the trenches with insulating dielectric material. As shown in FIG. 5(b), there is thus deposited a layer 160 comprising dopant material that substantially conforms to the sidewall and bottom of the isolation structure 101 and forms a layer on top of the formed sacrificial nitride mask 155 at the substrate surface. In one embodiment, a preferred isolation structure sidewall dopant material may include a doped glass (e.g., silicon oxide) film, having p-type dopants, such as boron or indium. Exemplary types of films comprising layer 160 may include a silicon oxide film containing phosphorus (PSG), or a silicon oxide film containing boron (e.g., boro-silicate glass or BSG) may be used as providing the dopant material to be out-diffused according to the invention. The deposition of the doped glass film may be performed by well-known chemical vapor deposition (CVD) techniques. One technique that has been used to deposit thin films on semiconductor substrates is low-pressure chemical vapor deposition (LPCVD). Preferably, a process is performed to enable precise control of a thickness of layer 160 and similarly, to tightly control the dopant concentration of layer 160. Such concentrations of layer 160 may range from the low to high $1 \times 10^{18}$ atoms/cm$^3$.

Figure 5C:
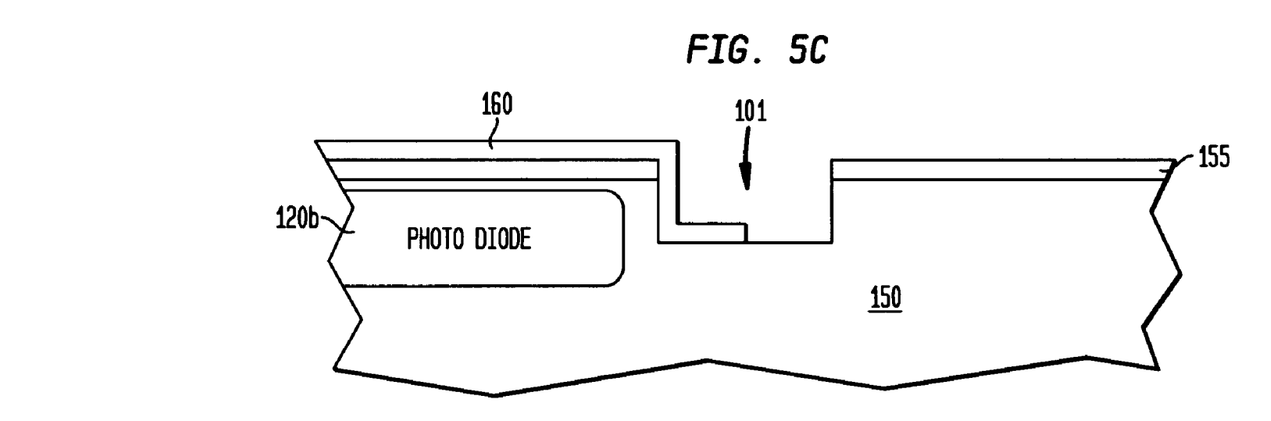
Figure 5D:
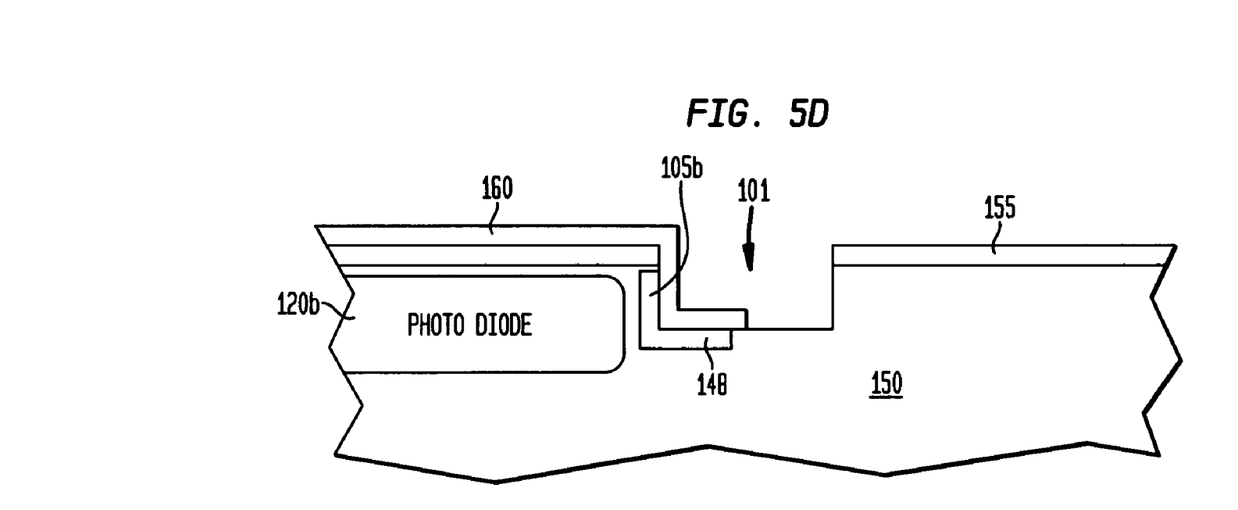
Figure 5E:
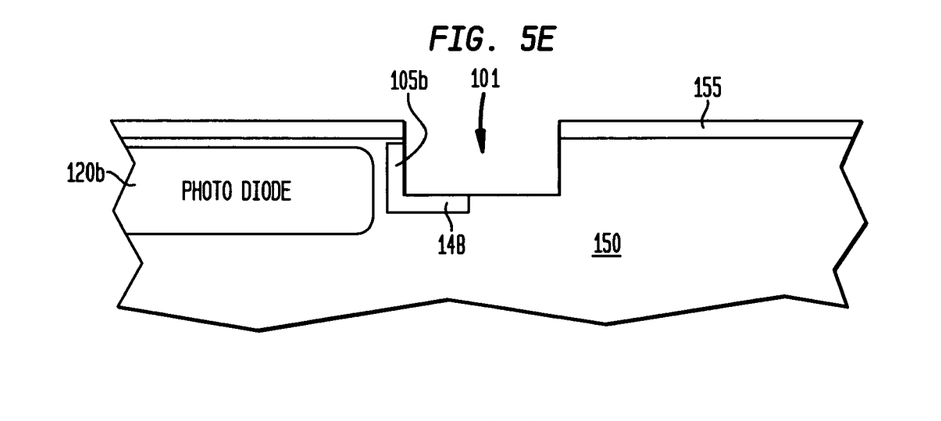

In the next step, as shown in FIG. 5(c), a lithographic mask (e.g., comprising a patterned photoresist layer) and directional or anisotropic etch process (e.g., Reactive Ion Etching) steps are performed to selectively remove the doped material layer 160 in the regions where it is undesirable to dope the isolation structure sidewall and leave selected portions of doped material layer 160 where doping in the isolation structure sidewall is desired. Then, as shown in FIG. 5(d), the structure of FIG. 5(c) including the remaining selected portions of doped layer 160 is subjected to a high temperature anneal sufficient to drive the dopant material in layer 160 into the underlying silicon forming out-diffused doped isolation structure sidewall 105b and isolation structure bottom portion 148. It is understood that a "capping layer" (e.g., an undoped oxide) may be formed over the entire structure encapsulating doped material layer 160 so that during the anneal step, dopant will be prevented from diffusing into the ambient furnace environment but rather diffuse into the substrate. The pad nitride layer 155 acts as a diffusion barrier. Preferably, the temperature and timing of the anneal process is such to ensure adequate out-diffusion of dopant material concentration, e.g., boron, into the selected isolation structure sidewall and bottom regions to ensure electrical conductivity from the top of the formed surface pinning layer of the photodiode 120b to the underlying lightly-doped substrate 150. As an example, the anneal process may comprise application of 1120° C. for a period of 1–2 minutes in an oxidizing N$_2$ environment (e.g. about 2% or less of oxygen and about 98% nitrogen). Furnace anneals may additionally be employed. Conditions in the 1000° C.–1050° C. range in either a nitrogen (with low percentage oxygen content to avoid SiO generation) or oxidizing ambients are effective. Depending on the degree of out-diffusion desired, and the integration of this process with the isolation of the diffusions, conditions from 800° C. to 1100° C. in a furnace with times from 10–300 minutes or rapid anneal thermal annealing in a temperature range from 900° C. to 1200° C. with a time less than about twelve minutes would be effective. It is understood that the thickness and the dopant concentration of doped regions 105b and 148 can be very closely controlled by the temperature and duration of the annealing step. Finally, as shown in FIG. 5(e), the remaining portions of doped material layer 160 is removed (stripped) using well-known techniques to form the partially doped isolation structure depicted in FIG. 4(b). To form the doped isolation structure depicted in FIG. 4(a), the step of selectively removing the doped material layer 160 (see FIG. 5(c)) is eliminated and the high temperature anneal is performed on the doped material layer 160 as depicted in FIG. 5(b).

It is understood that the pinning layer and collection well of the pixel sensor cell photodiode may be formed either before or subsequent to the isolation structure sidewall doping formation, and, prior to filling the isolation structure with the dielectric oxide (e.g., SiO$_2$) or like insulator material.

It is further understood that the techniques described herein with respect to FIGS. 5(a)–5(e) may be used to form selectively doped isolation structure sidewalls for both isolation structures 101a,b as shown in FIG. 3. Moreover, alternately, or in combination with the above-described methodology, a method for selectively doping isolation structure may be utilized whereby a photomask is applied in conjunction with angled implantation of dopant atoms in the sidewall and bottom portions such as described in commonly-owned, co-pending United States patent application Ser. No. 10/905,043.

Figure 6:
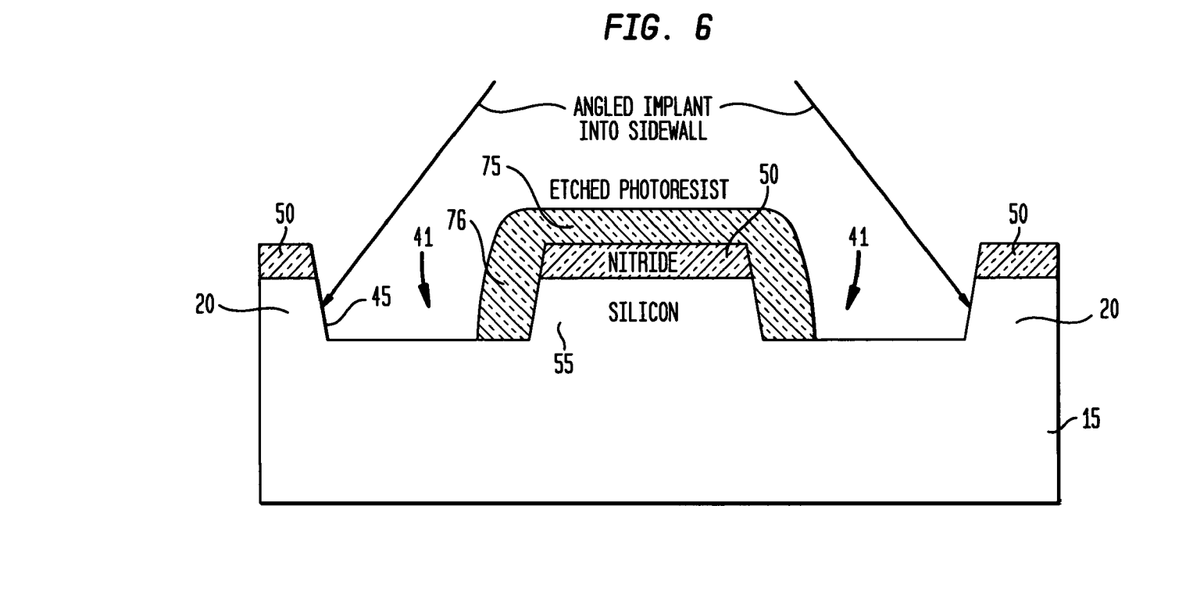

More particularly, as shown in FIG. 6, on top of a sacrificial nitride mask layer 50 formed atop active silicon or device regions 55 at the substrate surface where pixel sensor cell support devices are subsequently formed, a photoresist mask 75 initially formed having sharp edges (not shown) is patterned and etched. As shown in FIG. 6, to ensure proper dopant implant concentrations for forming the eventual electrical contact between the surface pinning layer 18 with the underlying substrate 15, it is understood that the height and spacing of the implant resist mask 75 is critical. Thus, an etch process is performed to tailor the topography of the photoresist layer 75, e.g., in one manner as shown in FIG. 6, and reduce it to render it possible to perform an angled implant. An angled implant 60 may then be performed to deposit dopant material into the sidewall 45 of an isolation structure 41. Assuming a p-type doped substrate, preferred isolation structure sidewall implant dopant materials includes p-type dopants, such as boron or indium.

To facilitate the angled implant to the sidewall edge past resist block masks, two methods are proposed: 1) a spacer type etch of the imaged photoresist; or, 2) a corner sputter process of the imaged photoresist. According to the first etch technique, a spacer type etch is implemented to pull down the imaged material and round off the corner edges simultaneously by having a vertical and horizontal etch component so the corner 76 is attacked from both directions. For example, a spacer type etch that comprises a directional or anisotropic process, which can be purely physical (e.g., a sputter etch) or have a chemical component (e.g., reactive ion etch or RIE). In either case, the etch process is selected to include a vertical etch component for etching the patterned photoresist layer to result in a desired resist layer height and, include a horizontal or lateral etch component at the bottom and at the top of the Si region to result in a photoresist pattern structure 75 having a rounded profile 76 as shown in FIG. 6.

An alternative method for etching the photoresist mask 75 is to provide a sputtering etch technique that chamfers off the patterned resist corner to achieve a similar result. In such an alternative process, the photoresist layer is formed by a non-chemical sputter etch process, e.g., an RF sputter etch, to result in the rounded profile shown in FIG. 6 allowing for the angled implant into the isolation structure sidewall. Preferably, the preferred process removes horizontal portions of the photoresist layer and the vertical portions, as well as providing a rounded corner profile. The sputter etch may be used to increase the resist slope at the corner, e.g., at an angle of 60° or less with respect to the horizontal. This corner slope is sufficient to enable an angled implant to achieve the objects of the invention.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A pixel sensor cell structure comprising:
   a substrate of a first conductivity type;
   a collection well layer of a second conductivity type formed below a substrate surface;
   a pinning layer of said first conductivity type formed atop the collection well layer at said substrate surface, and
   an isolation structure having first and second sidewalls wherein a first sidewall is formed adjacent to said pinning layer and collection well layer; and
   a dopant region comprising material of the first conductivity type selectively formed along said first sidewall of the isolation structure such that the dopant region electrically couples the pinning layer to the substrate,
   wherein said isolation structure is a shallow trench isolation region comprising an insulator material.

2. The pixel sensor cell structure as claimed in claim 1, wherein said second sidewall is dopant region free.

3. The pixel sensor cell structure as claimed in claim 2, wherein said second sidewall is formed proximate to a transistor device of an adjacent pixel sensor cell.

4. The pixel sensor cell structure as claimed in claim 1, wherein said substrate and said pinning layer of said first conductivity type is of a p-type material, said dopant material comprising a p-type material.

5. The pixel sensor cell structure as claimed in claim 4, wherein said dopant material comprises one of Boron or Indium.

6. The pixel sensor cell structure as claimed in claim 1, wherein said dopant region selectively formed along said first sidewall of the isolation structure is formed by ion implanting said material of the first conductivity type.

7. A pixel sensor cell structure comprising:
   a substrate of a first conductivity type;
   a collection well layer of a second conductivity type formed below a substrate surface;
   a pinning layer of said first conductivity type formed atop the collection well layer at said substrate surface, and
   an isolation structure having first and second sidewalls wherein a first sidewall is formed adjacent to said pinning layer and collection well layer; and
   a dopant region comprising material of the first conductivity type selectively formed along said first sidewall of the isolation structure such that the dopant region electrically couples the pinning layer to the substrate,
   wherein said dopant region selectively formed along said first sidewall of the isolation structure is formed by out diffusing a dopant material from a doped material layer formed inside said isolation structure into the first sidewall of the isolation structure.

8. The pixel sensor cell structure as claimed in claim 7, wherein said doped material layer is a doped glass film.

9. The pixel sensor cell structure as claimed in claim 8, wherein the doped glass film comprises a BSG film.

10. The pixel sensor cell structure as claimed in claim 8, wherein the doped material layer comprises a doped oxide.

11. A pixel cell array comprising at least two pixel cells, said array comprising:
    a first pixel cell adjacent to a second pixel cell;
    a first isolation structure isolating said first and second pixel cells, said first isolation structure having sidewalls,
    wherein a first sidewall adjacent to the first pixel cell is selectively doped with a dopant material and a second sidewall adjacent to the second pixel cell is not selectively doped with said dopant material.

12. The pixel cell array as claimed in claim 11, wherein said second pixel cell includes a transistor device located proximate said second sidewall of said first isolation structure.

13. The pixel cell array as claimed in claim 11, wherein said first pixel cell includes a photosensitive device having a pinned layer, said doped first sidewall electrically couples said pinned layer to a substrate.

14. The pixel cell array as claimed in claim 11, further comprising:
    a third pixel cell adjacent said first pixel cell; and,
    a second isolation structure isolating said first and third pixel cells, said second isolation structure having sidewalls,
    wherein a first sidewall of said second isolation structure adjacent to the first pixel cell is doped with a dopant material, and a second sidewall of said second isolation structure adjacent to the third pixel cell is doped with said dopant material.

15. The pixel cell array as claimed in claim 11, wherein said first and third pixel cells each include a photosensitive device having a pinned layer, said doped first and second sidewalls electrically couple each said pinned layer respectively to a substrate.

* * * * *